(12) United States Patent
Gaeta et al.

(10) Patent No.: US 9,490,605 B2
(45) Date of Patent: Nov. 8, 2016

(54) PARAMETRIC COMB GENERATION VIA NONLINEAR WAVE MIXING IN HIGH-Q OPTICAL RESONATOR COUPLED TO BUILT-IN LASER RESONATOR

(71) Applicant: Cornell University, Ithaca, NY (US)

(72) Inventors: Alexander Gaeta, Ithaca, NY (US); Michal Lipson, Ithaca, NY (US); Adrea R. Johnson, Ithaca, NY (US); Yoshitomo Okawachi, Lansing, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 0 days.

(21) Appl. No.: 14/786,319

(22) PCT Filed: Apr. 22, 2014

(86) PCT No.: PCT/US2014/035046

§ 371 (c)(1),
(2) Date: Oct. 22, 2015

(87) PCT Pub. No.: WO2015/012915

PCT Pub. Date: Jan. 29, 2015

(65) Prior Publication Data

US 2016/0134078 A1     May 12, 2016

Related U.S. Application Data

(60) Provisional application No. 61/814,773, filed on Apr. 22, 2013.

(51) Int. Cl.
*H01S 3/30*     (2006.01)
*H01S 3/108*    (2006.01)
(Continued)

(52) U.S. Cl.
CPC ............ *H01S 3/1083* (2013.01); *G02F 1/395* (2013.01); *H01S 3/0627* (2013.01); *H01S 3/06791* (2013.01); *H01S 3/083* (2013.01); *H01S 3/08086* (2013.01); *H01S 3/1028* (2013.01); *H01S 3/10061* (2013.01);
(Continued)

(58) Field of Classification Search
CPC .. H01S 3/1083; H01S 3/06791; H01S 3/083; H01S 3/1603; H01S 3/1608; H01S 3/08086; H01S 3/1028; H01S 3/10061; H01S 3/0637; H01S 3/0627; H01S 5/5054; H01S 5/5063
USPC ......................................................... 372/6
See application file for complete search history.

(56) References Cited

U.S. PATENT DOCUMENTS

2004/0100675 A1*  5/2004  Matsko ................ H01S 3/0627
                                                         359/245
2005/0220411 A1   10/2005  Ilchenko
(Continued)

*Primary Examiner* — Kinam Park
(74) *Attorney, Agent, or Firm* — Perkins Coie LLP

(57) ABSTRACT

The disclosed technology, in one aspect, includes an optical comb generator device which includes a laser cavity that includes an optical gain material to provide an optical gain and an optical path to allow laser light to circulate inside the laser cavity; and a high-Q resonator optically coupled in the optical path inside the laser cavity so that the laser light generated and sustained inside the laser cavity is in optical resonance with the high-Q resonator to cause laser light stored inside the high-Q resonator to have an optical intensity above a four wave mixing threshold of the high-Q resonator to cause parametric four wave mixing so as to produce an optical comb of different optical frequencies.

37 Claims, 6 Drawing Sheets

(51) Int. Cl.
*H01S 3/06* (2006.01)
*H01S 5/50* (2006.01)
*H01S 3/067* (2006.01)
*H01S 3/083* (2006.01)
*H01S 3/08* (2006.01)
*G02F 1/39* (2006.01)
*H01S 3/10* (2006.01)
*H01S 3/102* (2006.01)
*H01S 3/16* (2006.01)
*H01S 3/063* (2006.01)
*H01S 3/082* (2006.01)

(52) U.S. Cl.
CPC .......... *H01S 3/1603* (2013.01); *H01S 5/5054* (2013.01); *H01S 5/5063* (2013.01); *H01S 3/0637* (2013.01); *H01S 3/082* (2013.01)

(56) References Cited

U.S. PATENT DOCUMENTS

| | | |
|---|---|---|
| 2006/0215949 A1 | 9/2006 | Lipson et al. |
| 2007/0009205 A1 | 1/2007 | Maleki et al. |
| 2008/0056313 A1 | 3/2008 | Yamazaki |
| 2008/0285606 A1* | 11/2008 | Kippenberg .............. G02F 1/39 372/32 |
| 2012/0105177 A1 | 5/2012 | McLaren et al. |
| 2012/0327497 A1* | 12/2012 | Matsko .................. G02F 1/395 359/239 |
| 2013/0003766 A1* | 1/2013 | Savchenkov ............. G04F 5/14 372/38.01 |

\* cited by examiner

PARAMETRIC COMB GENERATION VIA NONLINEAR WAVE MIXING IN HIGH-Q OPTICAL RESONATOR COUPLED TO BUILT-IN LASER RESONATOR

PRIORITY CLAIM AND RELATED PATENT APPLICATIONS

This patent document is a 35 USC 371 National Stage application of International Application No. PCT/US2014/035046 filed Apr. 22, 2014, which further claims the benefit of U.S. Provisional Application No. 61/814,773 entitled "PARAMETRIC COMB GENERATION VIA NONLINEAR WAVE MIXING IN HIGH-Q OPTICAL RESONATOR COUPLED TO BUILT-IN LASER RESONATOR" and filed Apr. 22, 2013, the disclosures of which are incorporated by reference as part of the specification of this document.

STATEMENT REGARDING FEDERALLY SPONSORED RESEARCH OR DEVELOPMENT

This invention was made with government support under grant no. 5710003016 awarded by the Defense Advanced Research Projects Agency (DARPA) and grant no. FA9550-12-1-0377 awarded by the Air Force Office of Scientific Research (AFOSR). The government has certain rights in the invention.

TECHNICAL FIELD

This patent document generally relates to optical devices and techniques for generating optical signals.

BACKGROUND

Nonlinear wave mixing via optical nonlinearities in optical media can be used to generate optical signals. For example, parametric four-wave mixing (FWM) utilizing high-Q microresonators can be used to generate optical frequency combs, which find a wide range of applications including spectroscopy, optical clocks, arbitrary waveform generation, frequency metrology, and astronomical spectrograph calibration. In various implementations of microresonator-based frequency comb generation, a system is optically pumped by an external continuous wave (CW) laser at a specific wavelength corresponding to a cavity resonance of the microresonator in which the FWM occurs. As pump power is coupled into the microresonator, thermal effects can shift the cavity resonance to higher wavelengths, thus creating a soft thermal lock between the cavity resonance and the pump laser. When the intracavity power exceeds the threshold for parametric oscillation, cascaded FWM and higher-order FWM processes occur, resulting in the generation of a frequency comb (i.e., a precisely spaced source of monochromatic frequency components).

SUMMARY

The disclosed technology, in one aspect, includes an optical comb generator device which includes a laser cavity that includes an optical gain material to provide an optical gain and an optical path to allow laser light to circulate inside the laser cavity; and a high-Q resonator optically coupled in the optical path inside the laser cavity so that the laser light generated and sustained inside the laser cavity is in optical resonance with the high-Q resonator to cause laser light stored inside the high-Q resonator to have an optical intensity above a four wave mixing threshold of the high-Q resonator to cause parametric four wave mixing so as to produce an optical comb of different optical frequencies.

In another aspect, an optical comb generator device is provided to include a laser ring cavity that includes an optical gain material to provide an optical gain and an optical bandpass filter that controls a frequency of laser light to be amplified in the optical gain material; and a high-Q resonator optically coupled inside the laser ring cavity so that the laser light generated and sustained inside the laser ring cavity is in optical resonance with the high-Q resonator to cause parametric four wave mixing so as to produce an optical comb of different optical frequencies.

In another aspect, an optical comb generator device is provided to include a substrate; an optical waveguide ring formed on the substrate to provide a closed optical loop to circulate laser light in the optical waveguide ring; an optical amplifier formed on the substrate and optically coupled in the optical waveguide ring to provide an optical gain for the laser light; and a high-Q optical resonator formed on the substrate and optically coupled in the optical waveguide ring so that the laser light generated and sustained inside the optical waveguide ring is in optical resonance with the high-Q resonator to cause parametric four wave mixing so as to produce an optical comb of different optical frequencies.

In yet another aspect, a method is provided for generating an optical comb of different optical frequencies via nonlinear four wave mixing and includes operating a laser cavity that includes an optical gain material to produce an optical gain and an optical path to allow laser light to circulate inside the laser cavity; optically coupling a high-Q resonator in the optical path inside the laser cavity so that the laser light generated and sustained inside the laser cavity and in optical resonance with the high-Q resonator is selected to circulate inside the laser cavity while the laser light not in resonance with the high-Q resonator is eliminated; and causing the laser light in optical resonance with and stored inside the high-Q resonator to have an optical intensity above a four wave mixing threshold of the high-Q resonator to cause parametric four wave mixing so as to produce an optical comb of different optical frequencies.

The above and other aspects of the disclosed technology and their implementations are described in greater detail in the drawings, the description and the claims.

DETAILED DESCRIPTION

Figure 1A:
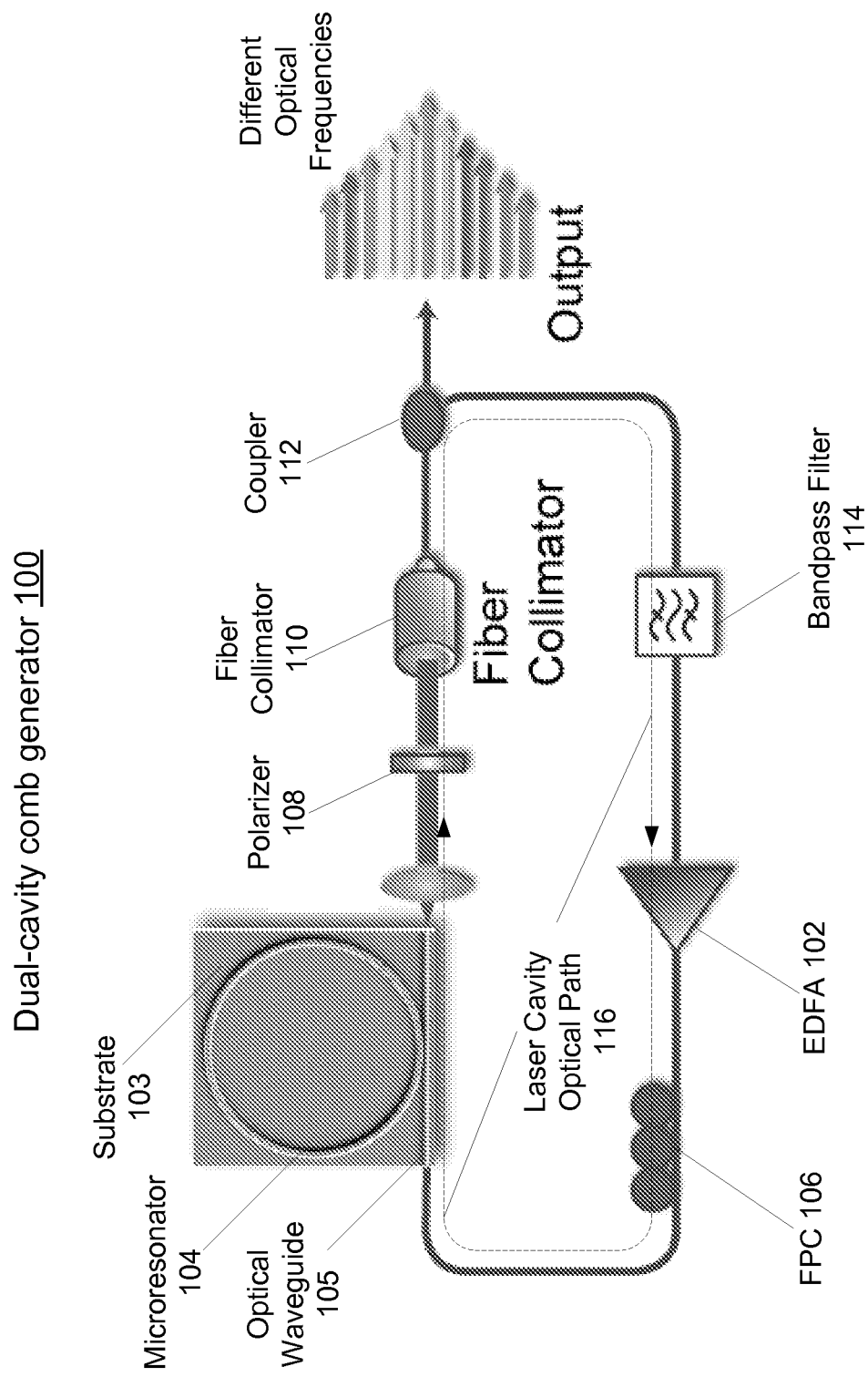
FIG. 1A illustrates an example of the proposed dual-cavity frequency comb generator which does not require an external CW pump laser.

Optical frequency comb generation can be achieved in various ways. For example, a continuous wave pump laser external to a microresonator can be used to optically pump the microresonator to cause nonlinear four-wave mixing (FWM) for the optical comb generation. In this method, however, fluctuations in the frequency or power of the continuous-wave (CW) pump laser can disrupt the thermal lock for the optical comb generation. This disruption of thermal lock disrupts the comb generation.

Disclosed are devices, systems, and techniques that enable the generation of a broadband optical frequency comb (i.e., a precisely spaced source of monochromatic frequency components) based on FWM in microresonators without the need for a single-frequency, continuous-wave CW pump laser source.

In one aspect, a technique for generating a broadband optical frequency comb is based on a dual-cavity design in which a high-Q microresonator is optically coupled to a laser cavity, e.g., being placed inside the laser cavity, so that the high-Q microresonator for causing FWM is optically coupled to the laser cavity for providing the optical gain and for causing the resonance of the high-Q microresonator and the laser frequency of the laser cavity to be optically locked to each other in frequency. Under this example dual-cavity design, the high-Q microresonator, which is optically inside the laser cavity, becomes an integral part of the laser cavity. The disclosed optical comb generator based on the dual-cavity design is different from various existing optical comb generators at least in that the laser cavity is no longer an external pump laser to the high-Q microresonator. Hence, the disclosed optical comb generator based on this dual-cavity design eliminates the need to apply a pump laser and automatically tunes, by the nature of the optical design, its frequency to a resonance of the microresonator, which greatly simplifies the design and reduces the cost. The proposed optical comb generator can also provide robust and stable optical comb generation without needing an external pump laser. Specific examples for the proposed dual-cavity-based optical comb generator (also referred to as "dual-cavity frequency comb generator," "dual-cavity optical comb generator," or "dual-cavity comb generator") are described below.

In one implementation of such a dual-cavity frequency comb generator architecture, a single bus waveguide (also referred to as a "through-port") can be used to form part of the external fiber cavity and is coupled to a microresonator. Due to the higher density of photonic states in the microresonator as compared to the fiber cavity, preferential emission occurs at the microresonator modes, resulting in lasing and parametric comb generation defined by the microresonator. Such a through-port configuration leads to a robust and stable comb generation in the absence of an external single-frequency CW pump laser. Additionally, because a single bus waveguide is coupled to the microresonator, the system operates with reduced coupling losses and allows for higher power efficiency. For example, a frequency comb generation spanning 900 nm has been demonstrated.

FIG. 1A illustrates an example of a specific implementation of the disclosed dual-cavity frequency comb generator 100 which does not require an external CW pump laser. The laser cavity in this example is a ring laser cavity and, in other implementations, a different laser cavity configuration can also be used.

Frequency comb generator 100 includes a ring laser cavity formed by various optical components, including, among others, an optical gain medium 102 that is energized to produce a sufficient optical gain in the ring laser cavity for initiating and sustaining a laser oscillation, a microresonator 104 optically coupled to the ring laser cavity to effectuate nonlinear four wave mixing inside to produce the optical frequencies for the optical comb, and optical paths or links for linking the optical gain medium 102, the microresonator 104 and various optical components to form the ring path 116 for the ring laser cavity. The optical gain medium 102 can be an optically pumped medium, e.g., an erbium-doped fiber amplifier (EDFA), or an electrically pumped medium, e.g., a semiconductor optical amplifier energized by a driving current. The microresonator 104 can be in various configurations to produce a sufficient high Q factor for the nonlinear four-wave mixing, such as a silicon-nitride ($Si_3N_4$) microresonator in some implementations. As illustrated in FIG. 1A, the microresonator 104 in this specific example is a waveguide ring resonator formed by a closed optical waveguide loop on a substrate 103. An optical waveguide 105 is formed on the substrate 103 and is directly coupled as part of the optical ring path 116 of the ring laser cavity. A portion of the microresonator 104 is positioned to be close to the optical waveguide 105 to enable optical evanescent coupling between the microresonator 104 and the optical waveguide 105 so that the microresonator 104 is optically coupled to the optical ring path 116.

During system operation, an amplified spontaneous emission (ASE) from EDFA 102 is coupled into the microresonator 104. Frequency comb generator 100 also includes a fiber polarization controller (FPC) 106 which is inserted between EDFA 102 and microresonator 104. FPC 106 allows for adjustment of the polarization of light coupled to the microresonator 104. Frequency comb generator 100 additionally includes a polarizer 108 which is placed at the output after the microresonator 104 to select quasi-TE polarization. In some implementations, the dispersion of the microresonator waveguide is carefully designed to optimize parametric FWM gain and oscillation for the TE modes.

After the microresonator 104 and the polarizer 108, a fiber collimator 110 is placed in the light path to collimate the optical beam, followed by a coupler 112 which is used for coupling out a portion of the light. In a particular implementation, coupler 112 is a 3-dB coupler. However, coupler 112 can also couple a different portion of the light as output. The remaining light in the external cavity is subsequently passed through a fixed bandpass filter 114 (e.g., 1553.83 nm-1560.1 nm) and fed back into the EDFA. The bandpass filter allows for control of the spectral region that experiences round-trip EDFA gain. In some implementations of the dual-cavity comb generator, bandpass filter 114 may be omitted. While the embodiment of frequency comb generator 100 uses a fiber amplifier as the optical gain material, other embodiments may use different types of optical gain mechanisms.

Note that dual-cavity frequency comb generator 100 includes a laser cavity that includes EDFA 102, FPC 106, an optical path (shown as the dotted line) 116 that allows light to circulate inside the laser cavity. In one implementation, at least a portion of the optical ring path 116 includes a fiber path for guiding laser light inside the laser cavity. The microresonator 104 is optically coupled to the optical path 116 so that the laser light generated and sustained inside the laser cavity is in optical resonance with the microresonator 104. This interaction between the microresonator 104 and the optical path 116 causes laser light to be stored inside the microresonator 104 to have an optical intensity above a four wave mixing threshold of the microresonator to cause parametric four wave mixing so as to produce an optical comb of different optical frequencies.

In particular implementation, microresonator 104 is a silicon-nitride ($Si_3N_4$) microresonator with a 725×1600-nm waveguide cross section and a 230-GHz free spectral range (FSR). In some implementations, frequency comb generator 100 in FIG. 1A is implemented over a substrate or chip so that the entire comb generator device is an on-chip device.

In the proposed comb generator design, the microresonator effectively acts as both a nonlinear element and a filter which selects the wavelengths that correspond to resonances of the microresonator for amplification in the EDFA. For such a frequency comb generation system, depending on the state of the input polarization, lasing of the dual-cavity can be achieved at either the fiber cavity modes or the microresonator modes. Below the lasing threshold, the probability of the system selecting either a microresonator mode or a mode of the external fiber cavity is directly proportional to the density of available states at that frequency. The enhancement of the density of states in a cavity may be given by the Purcell factor $F_p=(3\lambda^3/4\pi^2)(Q/V)$ where Q is the quality factor and V is the mode volume. When considering the cold-cavity modes, the Q-factor of the microresonator is significantly higher than that of the fiber cavity. This gives the resonances of the microresonator a correspondingly higher density of states, leading to a high transition probability to the frequencies corresponding to the microresonator resonance. Moreover, due to a lower threshold power for lasing, the modes corresponding to the microresonator cavity reach the oscillation threshold before the external fiber cavity. With sufficient power buildup, the microresonator cavity reaches the lasing threshold. Once lasing occurs, frequency dependent EDFA gain will preferentially amplify the lasing mode(s) to the point where it can serve as a pump for comb generation.

In the proposed comb generation system, the polarization is adjusted to quasi-TE, and as such, the coupling between the microresonator and the bus waveguide is optimized for the TE mode. When the polarization is adjusted away from quasi-TE, the Q-factor of the microresonator cavity decreases relative to that of the fiber cavity, and lasing occurs in modes corresponding to the external fiber cavity.

Figure 1B:
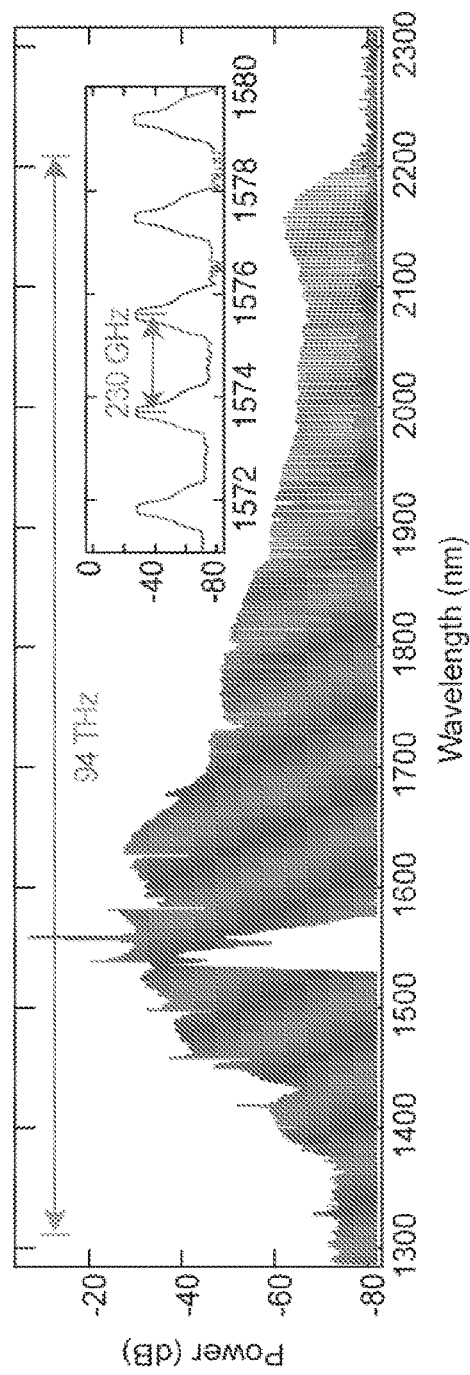
FIG. 1B shows the resulting frequency comb spectrum output from an implementation of the dual-cavity comb generator described in FIG. 1A.

FIG. 1B shows the resulting frequency comb spectrum output from an implementation of the dual-cavity comb generator described in FIG. 1A. The system is pumped with 2.17 W of EDFA power. The microresonator used is a 230-GHz free spectral range (FSR) microresonator with a waveguide cross section of 725×1600 nm. As can be seen in FIG. 1B, the dual-cavity design produces a broad frequency comb spectrum spanning 900 nm (94 THz). Comb generation occurs when the EDFA gain allows for sufficient power build-up of cavity modes that correspond to a single microresonator resonance to cause lasing, which serves as the pump for parametric frequency comb generation. This comb generation process has been verified by utilizing a 1.1-nm bandpass filter whose bandwidth is narrower than the FSR of the microresonator. This bandpass filter restricts the amplifier bandwidth to a narrow region surrounding a single microresonator resonance and indicates that a single lasing peak is responsible for the generation of the comb. Thus, this dual-cavity through-port configuration is effectively analogous to microresonator-based comb generation using an external CW pump laser.

To understand the spectral properties of the proposed dual-cavity system, simultaneous RF beatnote and optical spectral measurements are performed on the microresonator output, with the bandpass filter removed from the external fiber cavity.

Figure 2A:
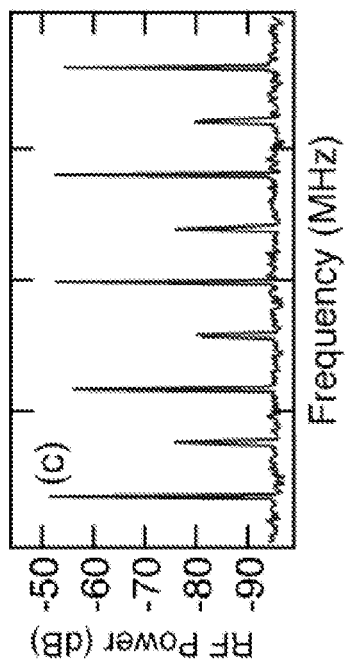
FIG. 2A illustrates an example of the optical output spectrum of the proposed dual-cavity system without the proposed coupling to the microresonator.
Figure 2C:
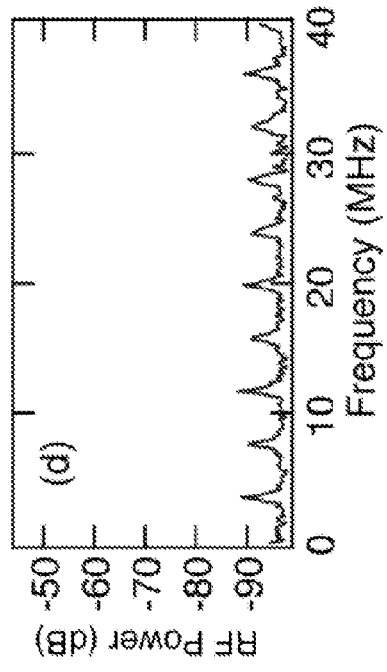
FIG. 2C illustrates the detected RF beatnote of 4.1 MHz, which corresponds to the FSR of the external cavity.
Figure 2B:
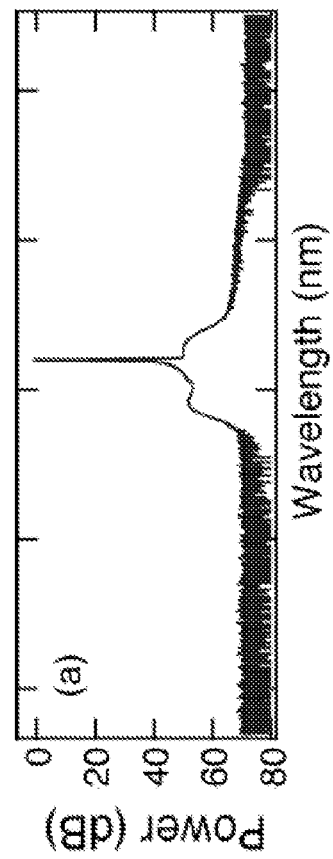
FIG. 2B illustrates an example of an optical output spectrum of the proposed dual-cavity system with the proposed coupling to the microresonator.

FIG. 2A illustrates an example of an optical output spectrum of the proposed dual-cavity system without the proposed the coupling to the microresonator. More specifically, by adjusting the polarization with the FPC 106, the external fiber cavity is made to lase without interaction with the microresonator 104 (i.e., decoupled from the microresonator 104). In comparison, FIG. 2B illustrates an example of an optical output spectrum of the proposed dual-cavity system with the proposed coupling to the microresonator. It is clear that the microresonator is needed for the parametric frequency comb generation.

The waveguide output in the setup of FIG. 2A is then sent to a 10-GHz bandwidth photodiode, and the resulting RF signal is measured using an RF spectrum analyzer. FIG. 2C illustrates the detected RF beatnote of 4.1 MHz, which corresponds to the FSR of the external cavity. Based on the quality factor of the silicon nitride microresonator used in the system, the resonances of the 230-GHz mode spacing of the silicon-nitride microresonator have a 1-GHz linewidth. Consequently, there are multiple modes of the external cavity that can be supported within a single resonance of the microresonator.

Figure 2D:
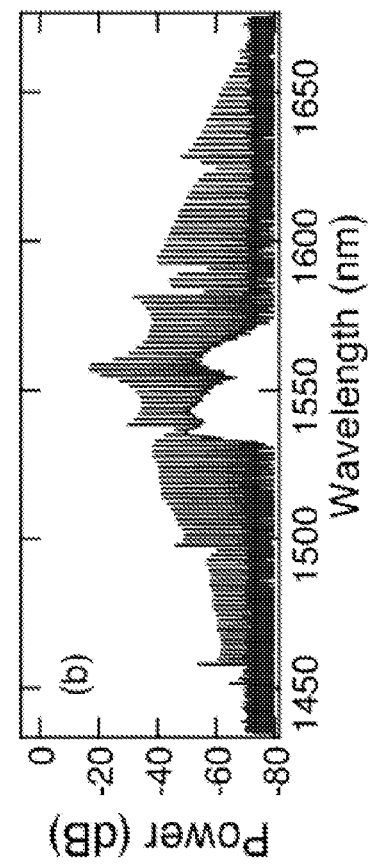
FIG. 2D illustrates that when a state of steady comb generation is reached (as in FIG. 2B), the amplitude of the corresponding RF beatnote drops by 40 dB.

Next, the polarization in the bus waveguide is rotated to quasi-TE so as to enable frequency comb generation and the entire comb spectrum is sent to the photodetector and the RF spectrum analyzer to detect the RF beatnote. FIG. 2D illustrates that when a state of steady comb generation is reached (as in FIG. 2B), the amplitude of the corresponding RF beatnote drops by 40 dB. It is expected that the system can be further improved to allow for single-mode operation by reducing the external cavity length. Additionally, it is expected that complete stabilization of the comb can be achieved through FSR control of both the microresonator and external fiber cavity. Microresonator FSR stabilization can be implemented through pump power or temperature control, while stabilization of the external fiber cavity FSR can be performed using a piezo-based delay arm.

In the above-described system tests, a dual-cavity design is used to produce broadband parametric frequency comb generation spanning 94 THz without the need of an external CW pump laser. Because the laser cavity selects the pump resonance automatically, pumping with an external cavity eliminates the need to carefully tune a CW pump laser into a resonance, thereby resulting in comb generation that is inherently robust. Further with the use of an on-chip amplifier, this dual-cavity design can provide the means of creating an integrated, compact, ultra-broadband wavelength comb source.

The above-described dual-cavity optical comb generation technique can provide self-starting devices where amplifier power and bandwidth can be controlled through the optical coupling of the two cavities without requiring any wavelength tuning or stabilization associated with operating a pump laser relative to a resonance of the high-Q microresonator. This technique eliminates pump power and thus eliminates frequency fluctuations that can shift the pump out of a resonance and disrupt comb generation. Such a comb generation device can be fabricated using standard, complementary-metal-oxide-semiconductor (CMOS) compatible processes and materials. For example, the microresonator can be made of silicon nitride and can be monolithically integrated, and compatible with existing silicon fabrication technology compatible with CMOS-processing. Such devices can be designed to provide flexibility in operating wavelength through dispersion engineering in CMOS-compatible materials, such as silicon nitride, silicon, aluminum nitride, and silicon carbide. The silicon nitride microresonator may be fabricated in a silicon nanofabrication facility using chemical vapor deposition and electron-beam lithography.

In some implementations of the proposed dual-cavity comb generator, the amplified spontaneous emission from the amplifier is coupled to the microresonator using a bus waveguide. The microresonator is used in the through-port configuration where there is a single bus waveguide coupled to the microresonator. The output is sent to a coupler where the power is partially ejected from the external cavity. The retained optical power is sent to a bandpass filter and the filtered portion is used to seed the amplifier. Power buildup in the microresonator due to the amplified spontaneous emission from the amplifier results in lasing corresponding to a single resonance of the microresonator. This lasing mode serves as the effective pump for frequency comb generation within the microresonator. The device can be pumped with a variety of fiber and semiconductor optical amplifiers with different operating wavelengths, including but are not limited to: Ytterbium-doped fiber amplifier (wavelength range of 1030-1100 nm); Erbium-doped fiber amplifier (1530-1610 nm); Thulium-doped fiber amplifier (1460-1530 nm); Thulium-doped fiber amplifier (1860-1900 nm); and semiconductor optical amplifier (850-1600 nm).

To allow for operation with various amplifiers, alternative microresonator platforms can be used, including but not limited to microresonators based on silicon (Si), silicon nitride ($Si_3N_4$), aluminum nitride (AlN), silicon carbide (SiC), and germanium (Ge). The microresonators may also be made by any one of the following materials: fused silica ($SiO_2$), high index glass, fluoride glass ($CaF_2$, $MgF_2$, $BaF_2$, LiF, NaF, $InF_3$, $AlF_3$, ZBLAN), telluride glass, chalcogenide glass, sapphire ($Al_2O_3$), quartz, diamond, gallium arsenide (GaAs), indium phosphide (InP), hydrogenated amorphous silicon (a-Si:H), lithium niobate ($LiNbO_3$), lithium tantalate ($LiTaO_3$), and zinc oxide (ZnO). Note that the proposed dual-cavity comb generator design may be fully integrated into a chip-scale device with the use of an integrated semiconductor amplifier.

In some implementations, an integrated heater can be used to stabilize the microresonator against thermal fluctuations in the proposed dual-cavity comb generator. In one embodiment, a low quality-factor ring can be included in the design to serve as an integrated filtering element that can be thermally tuned.

FIGS. 3 through 6 below provide additional technical information on the disclosed dual-cavity optical comb generators.

Figure 3:
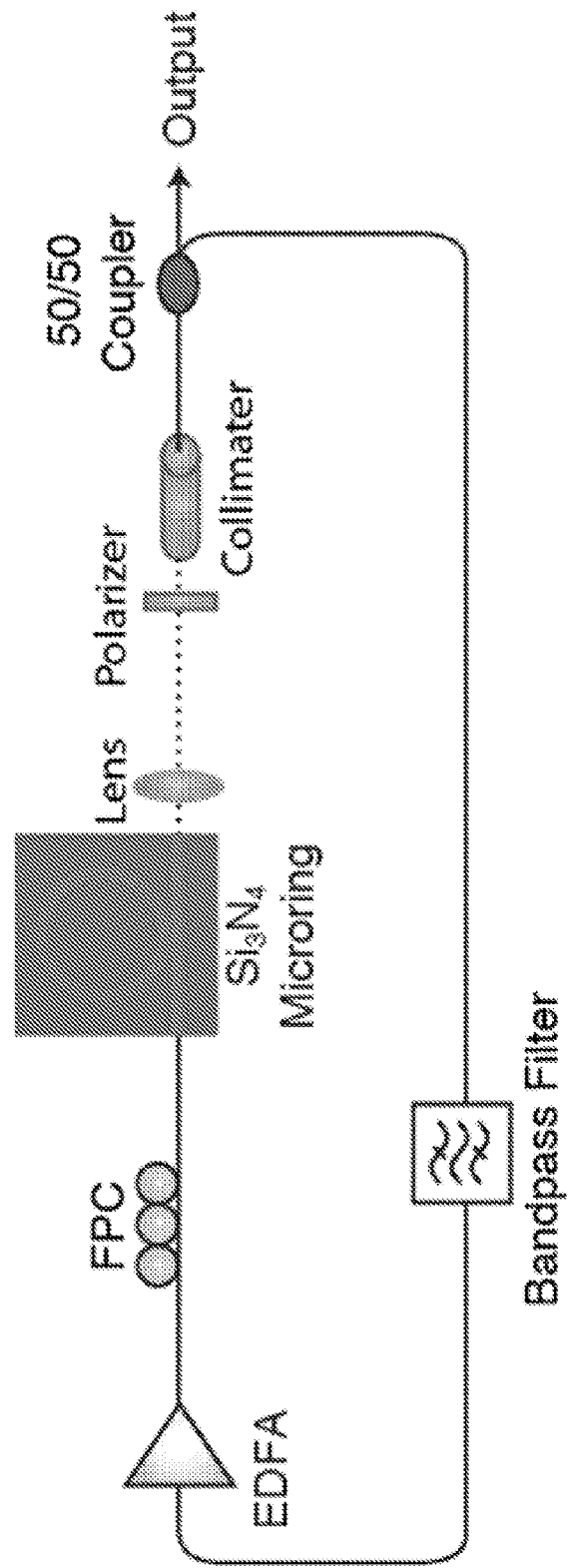
FIG. 3 illustrates another example of the proposed dual-cavity frequency comb generator which does not require an external CW pump laser.

FIG. 3 illustrates another example of the proposed dual-cavity frequency comb generator 300 which does not require an external CW pump laser. Frequency comb generator 300 is substantially similar to frequency comb generator 100 depicted in FIG. 1. As can be seen in FIG. 3, the microresonator in the form of a $Si_3N_4$ microring is pumped with an EDFA, and a FPC and polarizer are used to control the input polarization. A 50/50 coupler is used to output part of the collected light by the collimator, while the remainder of the light is passed through a bandpass filter and used to seed the EDFA.

Figure 4:
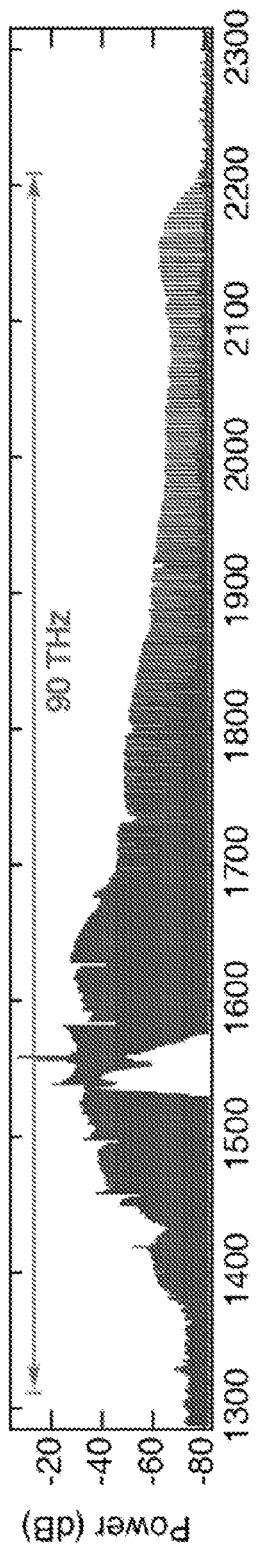
FIG. 4 illustrates a parametric frequency comb spectrum generated using the dual-cavity frequency comb generator depicted in FIG. 3.

FIG. 4 illustrates a parametric frequency comb spectrum generated using the dual-cavity frequency comb generator 300 depicted in FIG. 3. The microresonator, which is a 230-GHz FSR silicon-nitride microresonator, is pumped with an EDFA and produces a broad frequency comb spectrum spanning 900 nm.

Figure 5:
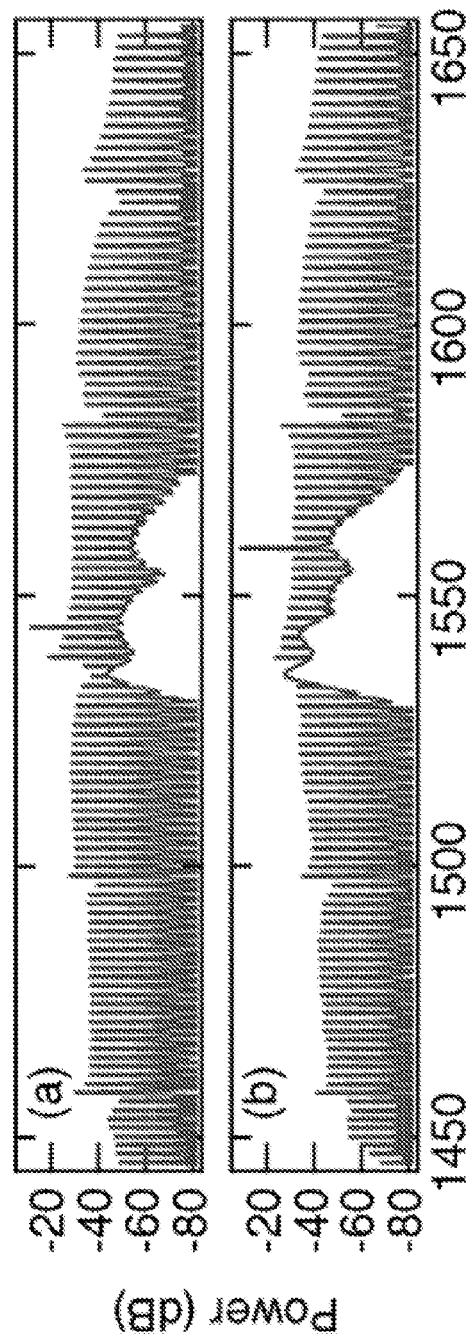
FIG. 5 illustrates a parametric frequency comb spectrum generated by a dual-cavity frequency comb generator based on the frequency comb generator depicted in FIG. 3 with a 1.1 nm bandpass filter.

FIG. 5 illustrates a parametric frequency comb spectrum generated by a dual-cavity frequency comb generator based on frequency comb generator 300 with a 1.1 nm bandpass filter. More specifically, the top plot in FIG. 5 illustrates a dual-cavity-based comb generation with a 1.1 nm bandpass filter centered at 1544 nm while the bottom plot in FIG. 5 illustrates a dual-cavity-based comb generation with a 1.1 nm bandpass filter centered at 1558.7 nm. Note that because the bandwidth of the filter is narrower than the FSR of the microresonator, these designs enable excitation of a single resonance, replicating microresonator-based comb generation using a single-frequency pump laser. The effective 'pump' wavelength can be controlled using a tunable optical bandpass filter.

Figure 6A:
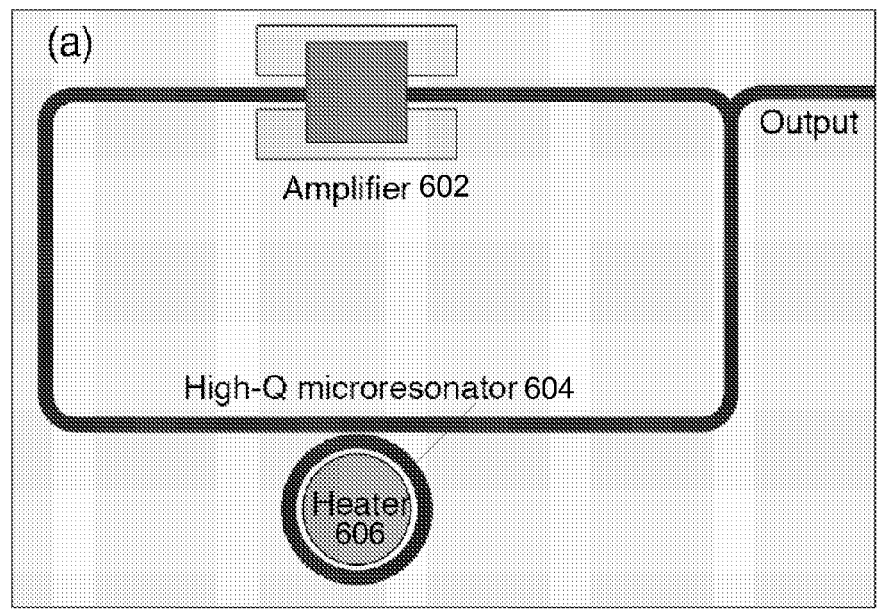
FIG. 6A illustrates an example of an integrated design for a dual-cavity comb generator including an on-chip amplifier and a high quality factor microresonator for comb generation where all components are formed over a substrate.

FIG. 6A illustrates an example of an integrated design for a dual-cavity comb generator 600 including an on-chip amplifier 602 and a high quality factor microresonator 604 for comb generation where all components are formed over a substrate. Within comb generator 600, the microresonator 604 can be implemented as a waveguide ring resonator or other microresonator designs. The resonances of the microresonator 604 can be thermally tuned with the use of a temperature control device, such as an integrated heater 606.

Figure 6B:
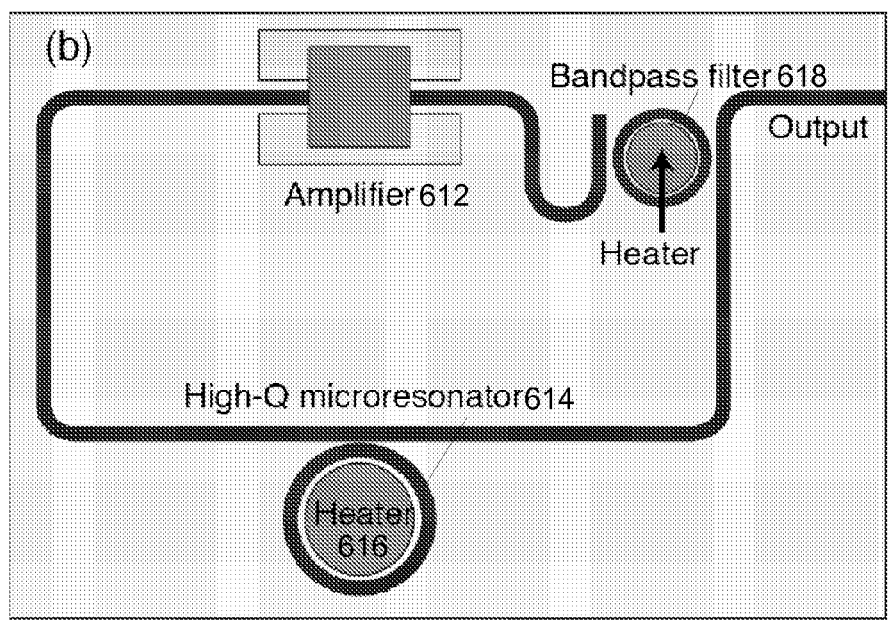
FIG. 6B illustrates another example of an integrated design for a dual-cavity comb generator formed over a substrate.

FIG. 6B illustrates another example of an integrated design for a dual-cavity comb generator 610 formed over a substrate. In addition to having an on-chip amplifier 612, a high quality factor microresonator 614, and an integrated heater 616, dual-cavity comb generator 610 includes an additional low Q-factor microresonator 618 to serve as a bandpass filter to control the central wavelength of operation.

The high Q-factor microresonator or the optical bandpass filter in the dual-cavity optical comb generator examples of FIGS. 6A and 6B may be implemented by a tunable electro-optic microring resonator using a metal-oxide-semiconductor (MOS) configuration and based on silicon-on-insulator design. A silicon electro-optic waveguide modulator is formed using a metal-oxide-semiconductor (MOS) configuration. In one example, a silicon-on-insulator structure can be used to form a micro-ring resonator intensity-modulator which exhibits switching times on the order of tens of ps with modulation depth of 73% with a bias voltage of 5 volts. For example, the high Q-factor microresonator or the optical bandpass filter in the dual-cavity optical comb generator can include a ring waveguide supported by a substrate; and a p-i-n junction embedded in the ring waveguide having highly doped p and n regions at least partially separated from a resonating mode of the ring waveguide. In implementations, the p-i-n junction can include highly doped regions on both an inside and outside of the ring waveguide; the ring waveguide can include a high aspect ratio rib of silicon; the p-i-n junction can include highly doped n regions on both an inside and outside of the ring waveguide. For another example, the high Q-factor microresonator or the optical bandpass filter in the dual-cavity optical comb generator can include: a ring waveguide supported by a substrate; and a MOS diode integrated with the ring waveguide to cause changes in a refractive index of the ring waveguide. In implementations, the MOS diode comprises: highly doped regions on both an inside and outside of the ring waveguide; and a gate separated from a top of the ring waveguide by a layer of insulation. U.S. Pat. No. 7,751,654 provides some examples of such tunable electro-optic microring resonators, the disclosure of which is incorporated by reference as part of the specification of this document.

Each of the disclosed dual-cavity optical comb generators offers the benefits of requiring only a narrow-band optical amplifier, as opposed to a stabilized single-frequency laser, and eliminating the need to pump at and tune to a resonance wavelength which eliminates disruptions to comb generation due to pump frequency fluctuations which can shift the pump out of resonance. The disclosed technology can greatly simplify the comb generation process and allow for a fully-integrated chip-scale multiple-wavelength source with an on-chip amplifier.

Various disclosed dual-cavity optical comb generators can be used in various applications, including, for example, compact, integrated, multiple wavelength, wavelength division multiplexed (WDM) sources in optical communications, and compact, portable multiple wavelength source for spectroscopic applications.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Only a few implementations and examples are described and other implementations, enhancements and variations can be made based on what is described and illustrated in this patent document.

What is claimed is what is described and illustrated, including:

1. An optical comb generator device, comprising:
   a laser cavity that includes an optical gain material to provide an optical gain and an optical path to allow laser light to circulate inside the laser cavity; and
   a high-Q resonator optically coupled in the optical path inside the laser cavity so that the laser light generated and sustained inside the laser cavity is in optical resonance with the high-Q resonator to cause laser light stored inside the high-Q resonator to have an optical intensity above a four wave mixing threshold of the high-Q resonator to cause parametric four wave mixing so as to produce an optical comb of different optical frequencies.

2. The device as in claim 1, wherein:
   the laser cavity includes a fiber amplifier as the optical gain material, a fiber path for guiding laser light inside the laser cavity.

3. The device as in claim 2, wherein the fiber amplifier includes an erbium-doped fiber amplifier (EDFA), a Ytterbium-doped fiber amplifier, a Thulium-doped fiber amplifier or a semiconductor optical amplifier.

4. The device as in claim 2, comprising:
   a polarization controller inside the laser cavity to control an optical polarization of the laser light inside the laser cavity.

5. The device as in claim 4, wherein the polarization controller is placed between the optical gain material and the high-Q resonator.

6. The device as in claim 4, wherein the polarization controller includes a fiber polarization controller (FPC).

7. The device as in claim 2, comprising:
   an optical bandpass filter inside the laser cavity to control a laser wavelength of the laser light sustained inside the laser cavity.

8. The device as in claim 7, wherein the optical bandpass filter is placed after an optical coupler used for coupling out a portion of the laser light but before the fiber amplifier.

9. The device as in claim 1, comprising:
   a polarizer which is placed inside the laser cavity after high-Q resonator to select a TE or TM polarization mode.

10. The device as in claim 1, wherein the dispersion of the high-Q resonator is designed to optimize parametric four-wave mixing (FWM) gain and oscillation for the selected TE or TM mode.

11. An optical comb generator device, comprising:
    a laser ring cavity that includes an optical gain material to provide an optical gain and an optical bandpass filter that controls a frequency of laser light to be amplified in the optical gain material; and
    a high-Q resonator optically coupled inside the laser ring cavity so that the laser light generated and sustained inside the laser ring cavity is in optical resonance with the high-Q resonator to cause parametric four wave mixing so as to produce an optical comb of different optical frequencies.

12. The device as in claim 11, wherein the laser ring cavity includes a fiber path.

13. The device as in claim 11, wherein the high-Q resonator is a tunable resonator.

14. The device as in claim 13, comprising a temperature control device coupled to the high-Q resonator to tune the high-Q resonator.

15. The device as in claim 11, wherein the high-Q resonator includes a tunable electro-optic microring resonator using a metal-oxide-semiconductor (MOS) configuration.

16. The device as in claim 11, wherein the high Q-factor resonator includes a ring waveguide supported by a substrate; and a metal-oxide-semiconductor diode integrated with the ring waveguide to cause changes in a refractive index of the ring waveguide.

17. An optical comb generator device, comprising:
a substrate;
an optical waveguide ring formed on the substrate to provide a closed optical loop to circulate laser light in the optical waveguide ring;
an optical amplifier formed on the substrate and optically coupled in the optical waveguide ring to provide an optical gain for the laser light; and
a high-Q optical resonator formed on the substrate and optically coupled in the optical waveguide ring so that the laser light generated and sustained inside the optical waveguide ring is in optical resonance with the high-Q resonator to cause parametric four wave mixing so as to produce an optical comb of different optical frequencies.

18. The device as in claim 17, wherein:
the high-Q optical resonator is a tunable optical resonator.

19. The device as in claim 18, comprising:
a resonator tuning mechanism on the substrate that tunes the high-Q optical resonator to change its resonance frequency.

20. The device as in claim 19, wherein:
the high-Q optical resonator exhibits an electro-optic effect and is tunable by a control electrical signal.

21. The device as in claim 19, wherein:
the resonator tuning mechanism includes a temperature control device that controls a temperature of the high-Q optical resonator to tune the high-Q optical resonator.

22. The device as in claim 21, wherein:
the temperature control device includes a heater.

23. The device as in claim 21, comprising:
an optical bandpass filter coupled in the optical waveguide ring and configured to control a frequency of laser light in the optical waveguide ring.

24. The device as in claim 23, wherein:
the optical bandpass filter is a tunable filter.

25. The device as in claim 24, comprising:
a filter tuning mechanism on the substrate that tunes the tunable filter.

26. The device as in claim 25, wherein:
the filter tuning mechanism includes a temperature control device that controls a temperature of the tunable filter.

27. The device as in claim 26, wherein:
the temperature control device includes a heater.

28. The device as in claim 17, comprising:
an optical bandpass filter coupled in the optical waveguide ring and configured to control a frequency of laser light in the optical waveguide ring.

29. The device as in claim 28, wherein:
the optical bandpass filter is a tunable filter.

30. The device as in claim 29, comprising:
a filter tuning mechanism on the substrate that tunes the tunable filter.

31. The device as in claim 29, wherein:
the tunable filter includes an optical resonator that exhibits an electro-optic effect and is tunable by a control electrical signal.

32. The device as in claim 28, wherein:
the optical bandpass filter includes an optical resonator filter which includes an optical resonator formed on the substrate.

33. The device as in claim 32, comprising:
a heater coupled to the optical resonator filter to tune the optical resonator filter.

34. A method for generating an optical comb of different optical frequencies via nonlinear four wave mixing, comprising:
operating a laser cavity that includes an optical gain material to produce an optical gain and an optical path to allow laser light to circulate inside the laser cavity;
optically coupling a high-Q resonator in the optical path inside the laser cavity so that the laser light generated and sustained inside the laser cavity and in optical resonance with the high-Q resonator is selected to circulate inside the laser cavity while the laser light not in resonance with the high-Q resonator is eliminated; and
causing the laser light in optical resonance with and stored inside the high-Q resonator to have an optical intensity above a four wave mixing threshold of the high-Q resonator to cause parametric four wave mixing so as to produce an optical comb of different optical frequencies.

35. The method as in claim 34, comprising:
tuning the high-Q resonator to change a resonance frequency.

36. The method as in claim 35, wherein the turning of the high-Q resonator is achieved by controlling a temperature.

37. The method as in claim 35, wherein the turning of the high-Q resonator is achieved via an electro-optic effect of the high-Q resonator.

* * * * *